(12) United States Patent
Wang

(10) Patent No.: US 8,103,995 B2
(45) Date of Patent: Jan. 24, 2012

(54) METHOD FOR OPC CORRECTION

(75) Inventor: Li-Ming Wang, Taoyuan County (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 273 days.

(21) Appl. No.: 12/356,482

(22) Filed: Jan. 20, 2009

(65) Prior Publication Data

US 2010/0185998 A1 Jul. 22, 2010

(51) Int. Cl.
 *G06F 17/50* (2006.01)
(52) U.S. Cl. .......................... 716/100; 716/50
(58) Field of Classification Search .............. 716/1, 21, 716/100, 50
See application file for complete search history.

(56) References Cited

U.S. PATENT DOCUMENTS

| | | | |
|---|---|---|---|
| 7,245,356 B2 * | 7/2007 | Hansen | 355/67 |
| 7,514,183 B2 * | 4/2009 | Hsu et al. | 430/5 |
| 2005/0196682 A1 * | 9/2005 | Hsu et al. | 430/5 |
| 2005/0268256 A1 * | 12/2005 | Tsai et al. | 716/4 |
| 2006/0126046 A1 * | 6/2006 | Hansen | 355/55 |
| 2007/0266362 A1 * | 11/2007 | Lai et al. | 716/19 |
| 2010/0180251 A1 * | 7/2010 | Ye et al. | 716/19 |

* cited by examiner

*Primary Examiner* — Suchin Parihar

(57) ABSTRACT

An optical proximity correction method is disclosed, comprising establishing an optical proximity correction (OPC) model, and performing an OPC correction step to correct segments of a layout pattern. The OPC correction comprises the step of defining an edge of the layout pattern neighboring a hot-spot location on a mask to locate a target point and a dissection point. The step of locating the target point and the dissection point includes setting a plurality of pre-target points and pre-dissection points, and electing a target point and a dissection point for correcting the segments of the layout pattern from the pre-target points and pre-dissection points according to image quality of the pre-target points and pre-dissection points.

3 Claims, 4 Drawing Sheets

METHOD FOR OPC CORRECTION

BACKGROUND OF THE INVENTION

1. Field of the Invention

The invention relates to an optical proximity correction (OPC) method, and more particularly relates to an OPC correction recipe of an optical proximity correction method.

2. Description of the Related Art

OPC methods are used to eliminate critical dimension variation of lithography masks during fabrication. The transfer of original patterns to a semiconductor substrate is corrected using a software program involving computations, in which different patterns from the original patterns are obtained. The patterns corrected by OPC are then transferred to a mask. After the OPC correction, the pattern formed by light passing through the mask and irradiating the semiconductor substrate is similar to the original pattern.

FIGS. 1A and 1B show correction steps of a conventional optical proximity correction method. Referring to FIG. 1A, after an OPC model is established, the step of correcting the layout pattern according to the OPC model is conducted. An edge of a pattern on the mask is divided into a plurality of segments and each segment is defined to have a target point used as a reference when correcting the layout patterns. The segment is corrected inwardly or outwardly according to comparison with the target point reference. When defining the segments, the conventional art typically defines target points 101, 102 and 103 and dissection points 104 and 105 on the edge of the pattern of the mask. Each segment is defined according to the target points, which are calculated using the OPC model and the inward or outward corrected degree is determined accordingly. As shown in FIG. 1B, the above steps allow the target points 101, 102 and 103 to pass the after development inspection (ADI) pattern profile 110. It is noted that the conventional OPC art determines the first target point 102 and the first dissection point 104 of the critical region 106, such as the corner region of a polygon pattern or an end of a line, according to experience, wherein only the conformity is emphasize. As well, the distance from the first target point 102 to the first dissection point 104 is constant, and the segment corresponding to the first target point 102 is fixed. In addition, the inward or outward amount of the corrected segments (segments from vertex 108 to the first dissection point 104) is also constant in the conventional art and only the ADI profile 110 passing through the first target points 102 is of concern.

Although the conventional art allows exposure of patterns with good conformity, the lithography process window, however, is not taken into account. Therefore, the resulting mask layout still has deficiencies.

BRIEF SUMMARY OF INVENTION

Due to the issues described, the invention provides an optical proximity correction method, comprising establishing an optical proximity correction (OPC) model, performing an OPC correction step to correct segments of a layout pattern. The OPC correction steps comprise defining an edge of the layout pattern neighboring a hot-spot location on a mask to locate a target point and a dissection point. The step of locating the target point and the dissection point includes setting a plurality of pre-target points and pre-dissection points, and electing a target point and a dissection point for correcting the segments of the layout pattern from the pre-target points and pre-dissection points according to image quality of the pre-target points and pre-dissection points.

In another aspect, the invention provides an optical proximity correction method, comprising establishing an optical proximity correction (OPC) model and performing a correcting layout and simulating image quality step. The OPC method comprises setting a plurality of pre-target points and pre-dissection points, electing a target point and a dissection point for correcting the segments of the layout pattern from the pre-target points and pre-dissection points according to a normalized image log slope (NILS) and a mask error enhancement factor (MEEF) of the pre-target points and pre-dissection points, and outputting a layout according to the corrected pattern.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the contemplated mode of carrying out the invention. This description is made for the purpose of illustrating the general principles of the invention and should not be taken in a limiting sense, not for limiting the invention.

Figure 1A:
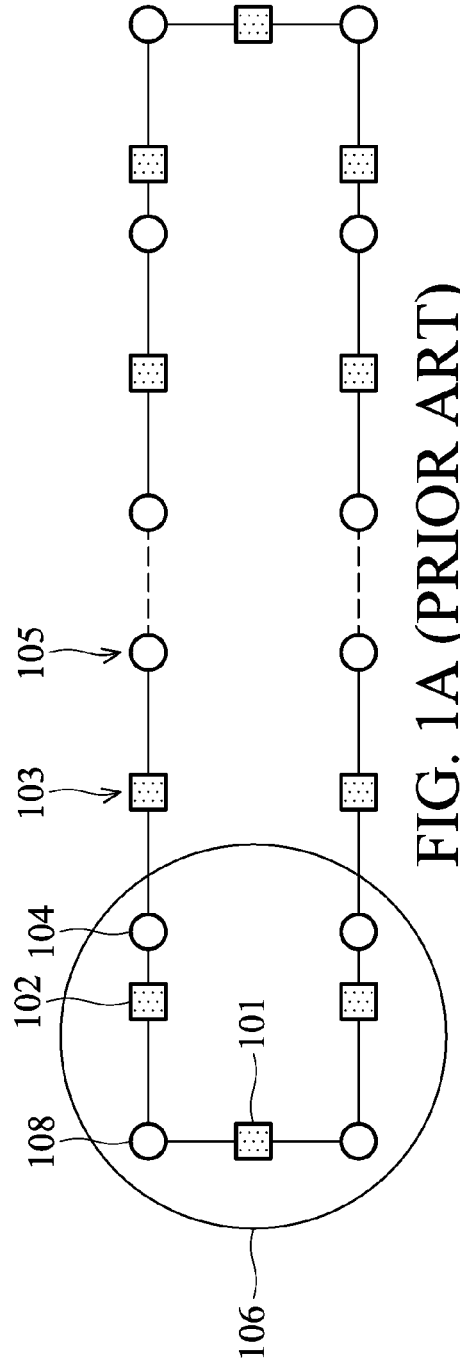
FIGS. 1A and 1B show correction steps of a conventional optical proximity correction method.
Figure 1B:
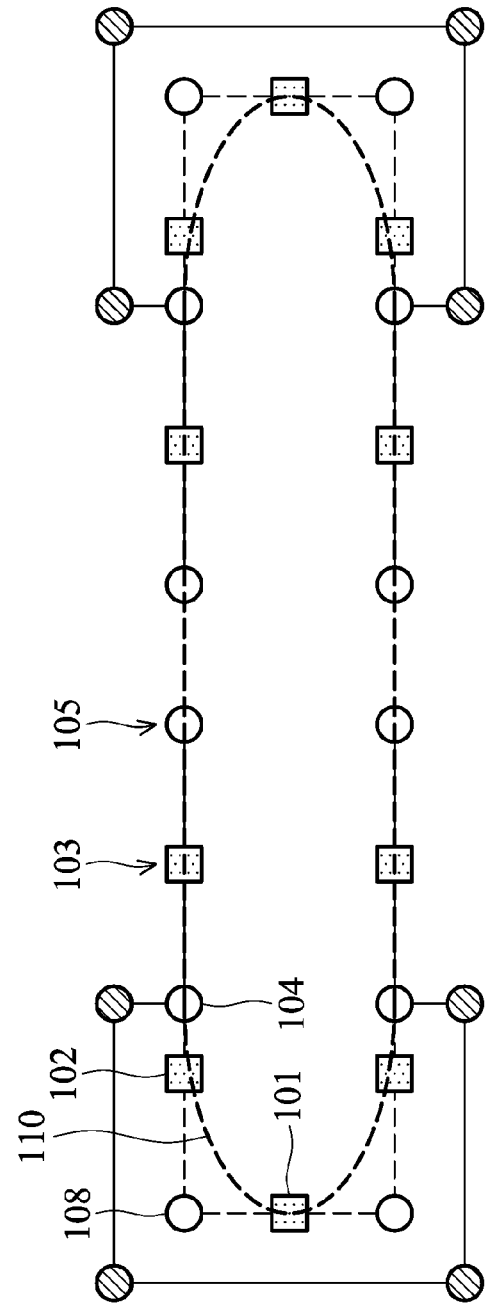
Figure 2:
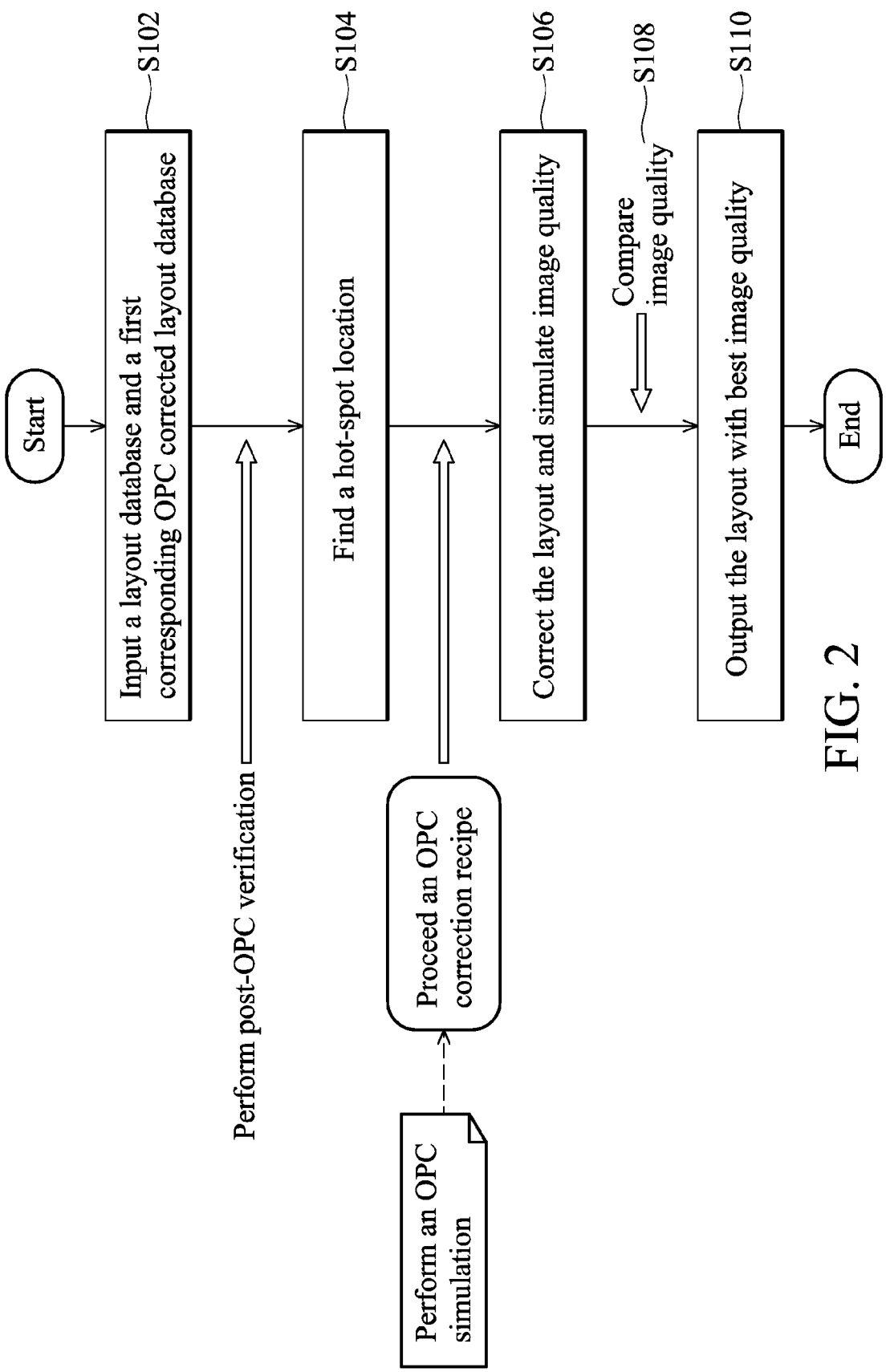
FIG. 2 shows a flow chart of an OPC method of an embodiment of the invention.
Figure 3:
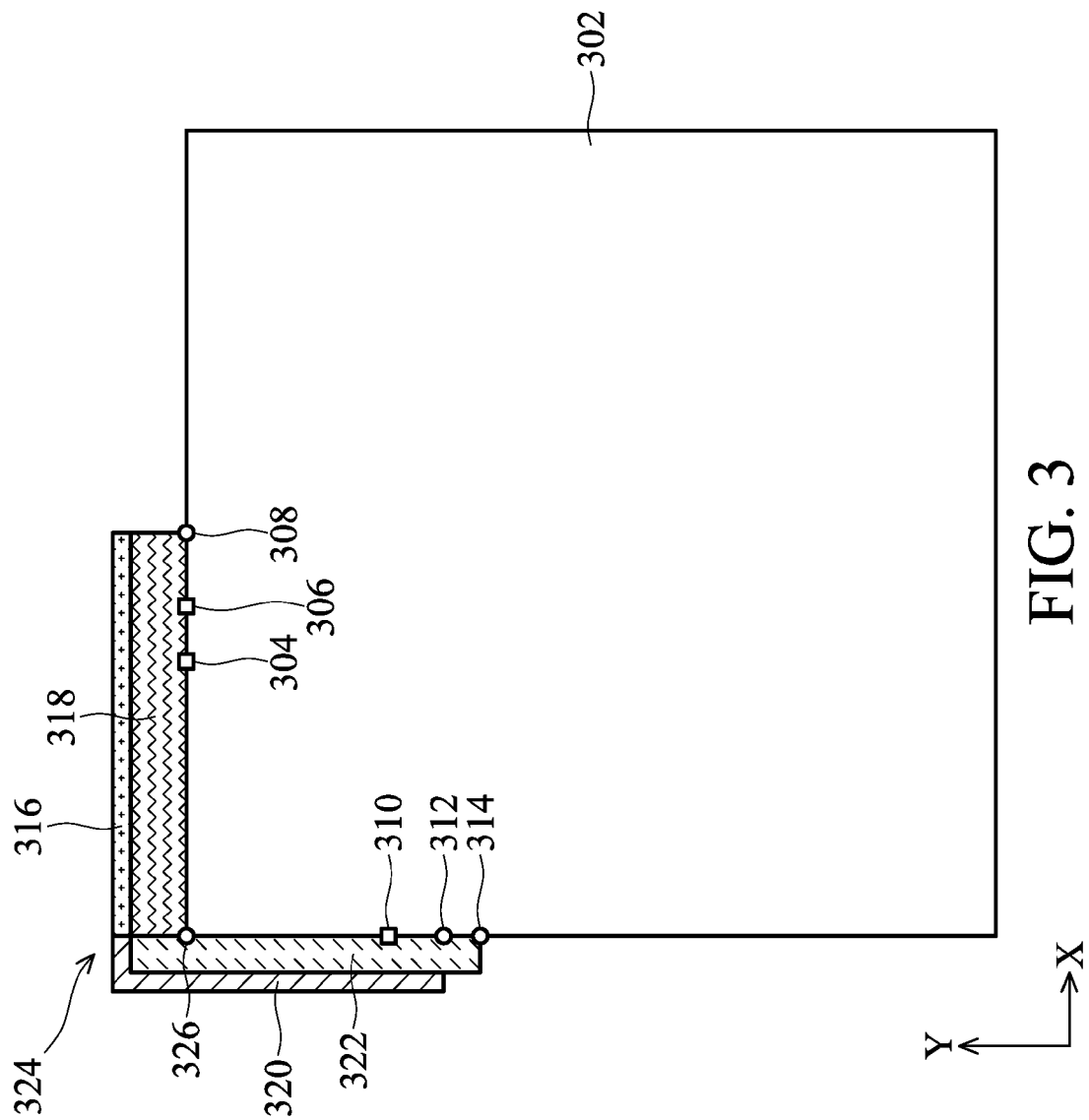
FIG. 3 shows a plan view of a mask layout to illustrate an correction step of an OPC method of an embodiment of the invention.

Referring to FIG. 2 and FIG. 3, in which FIG. 2 shows a flow chart of an embodiment of the invention and FIG. 3 supplements illustration of the embodiment. To begin, a layout database and a first corresponding OPC corrected layout database are inputted in step S102. Next, post-OPC verification is performed to verify the layout and hot-spot locations are located in step S104, wherein the hot-spot locations are critical layout regions of the lithography process and are of the troublesome areas of the lithography process window. Thereafter, an OPC simulation is performed and an OPC correction recipe is proceeded to correct the layout and simulate image quality at the hot-spot locations in step S106. Next, a comparison of the image quality is performed in step S108. Following, the layout with the best image quality is outputted in step S110.

Note that the portion from step S106 to step S110 is especially important in the invention and is illustrated hereafter, in accordance with FIG. 3. Referring to FIG. 3, a polygon 302 on a mask is corrected with a adjusted OPC recipe to divide the edge of the polygon 302 into a plurality of segments (the polygon is shown as a rectangular figure in this figure, but the invention is not limited thereto). The invention is specifically related to definition of target points and dissection points at the region neighboring to the hot-spot location 324 of the layout pattern. When a dissection point 308 is selected along the direction X, a plurality of pre-target points, such as the first pre-target point 304 and the second pre-target point 306, can be set according to the dissection point 308. Note that different target points have different inward or outward distances of the corrected segments, even if they are directed to the same dissection point. For example, the first pre-target point 304 generates the first corrected segment 316, and the second pre-target point 306 generates the second corrected segment 318, wherein the ADI image qualities are different in accordance with the different corrected segments. Referring to the example along the direction Y, when a target point 310 is selected, a plurality of pre-dissection points, such as the first pre-dissection point 314 and the second pre-dissection point 312 shown in this figure, can be set according to the selected target point. Note that different dissection points have different inward or outward distances of the corrected segments, even if they are directed to the same target point 310. For example, the first pre-dissection point 314 generates the third corrected segment 322, the second pre-dissection point 312 generates the fourth corrected segment 320, and the ADI image qualities are different in accordance with the different corrected segments. According to the previous example, the first pre-target point 304, the second pre-target point 306, the first pre-dissection point 314 and the second pre-dissection point 312 will generate four sets of corrected segments, including the first corrected segment 316, the second corrected segment 318, the third corrected segment 322 and the fourth corrected segment 320. The embodiment adjusts the corrected segment having the greatest lithography process window and image quality in the four sets of corrected segments, and thus determines which dissection point and target point should be used. In more detail, the invention determines positions of the first target point and the first dissection neighboring the vertex 326 in the hot-spot location 324 according to the which positions result in the greatest lithography window and best image quality. Note that although the embodiment of the invention uses four corrected segments generated by two pre-dissection points 314 and 312 and two pre-target points 304 and 306 as a reference, the invention does not limit the number of pre-target points and/or pre-dissection points. The greater the number of pre-target points and/or pre-dissection points set in the invention, the better the image quality. However, consideration must be given to increased processing duration. For example, if three pre-target points and three pre-dissection points are used in another embodiment of the invention, nine sets of corrected segments are generated. If four pre-target points and four pre-dissection points are used in yet another embodiment of the invention, sixteenth sets of corrected segments are generated and so on.

Figure 4:
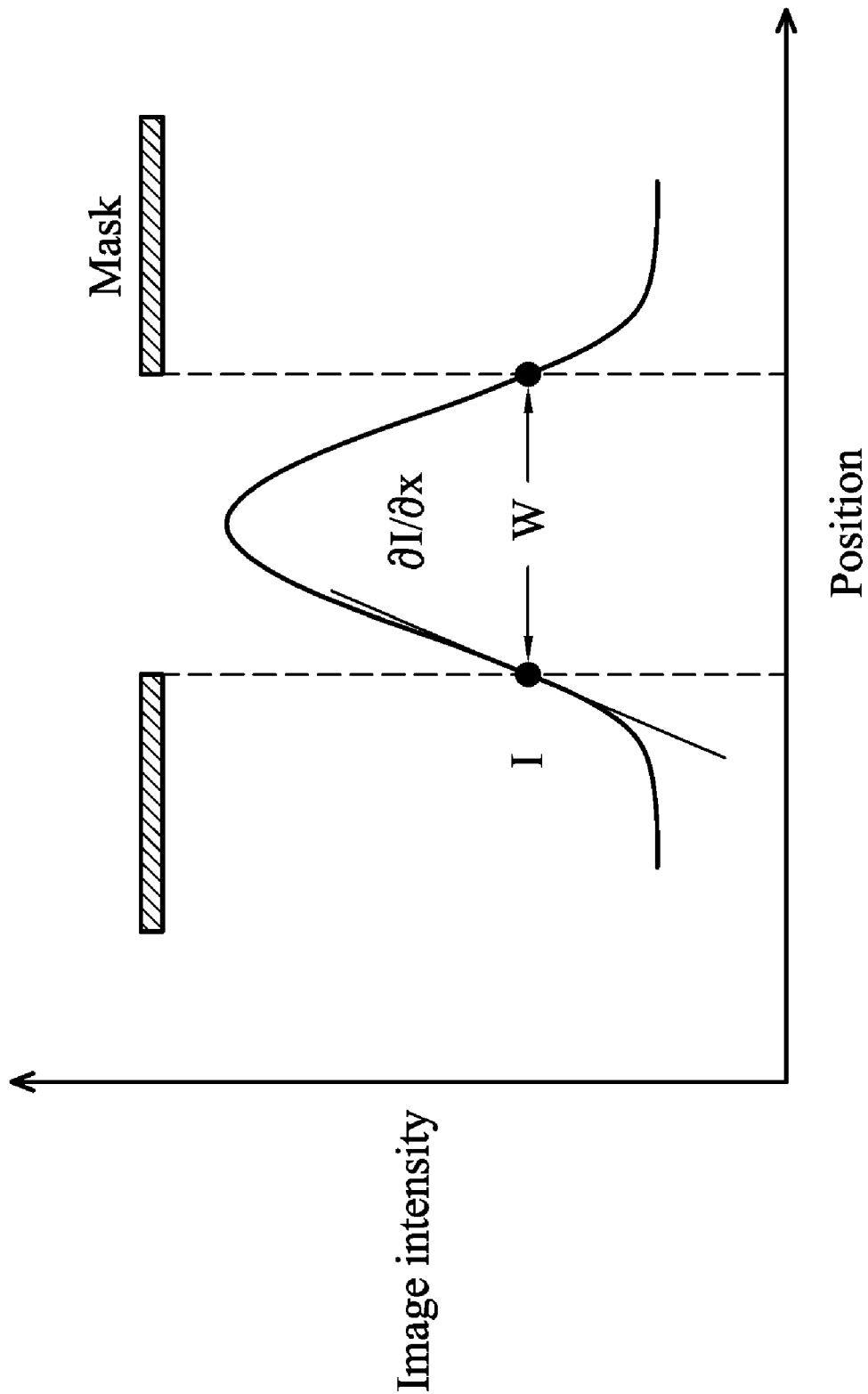
FIG. 4 shows a curve with image intensity as a function of distance.

The parameters for defining image quality is illustrated as follows. Image contrast is an important parameter of image quality and it is generally defined by a normalized image log slope (NILS). Referring to FIG. 4, the steeper the slop of the image intensity in the opening of the mask is, the greater the image contrast. The normalized image log slope (NILS) can be presented by the formula as follows:

$$NILS = w\frac{d\ln(l)}{dx},$$

wherein w is width of the opening of the mask, l is image intensity, x is position. The greater the NILS of the measured image is, the greater the image contrast.

Mask error enhancement factor (MEEF) is another important parameter of image quality and it can be presented by the formula as follows:

$$MEEF = \frac{\partial CD_{resist}}{\partial CD_{mask}},$$

wherein $\partial CD_{mask}$ is critical dimension of the mask, $\partial CD_{resist}$ is the critical dimension of the resist exposed by the mask. A smaller MEEF means that the critical dimension of the resist does not vary severely in accordance with the critical dimension of the mask. This means that resist critical dimension is stable and image quality is good (the highest MEEF is 1.0).

Accordingly, locations of target points and dissection points of the embodiment of the invention, specifically the first target point and the first dissection point neighboring the hot-spot location, can be determined according to which pre-target point and/or pre-dissection point results in the greater NILS and/or smaller MEEF.

Therefore, a preferred embodiment of the invention can output layout having best image quality, having greatest NILS and/or smallest MEEF, according to the methods described.

Note, that the defined target point and dissection point are not fixed points when performing the OPC correcting step, and the divided segment is flexible by considering not only conformity of design layout but also lithography process window to define better image quality.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a device, comprising:
    obtaining a design layout comprising a layout pattern including features;
    establishing an optical proximity correction (OPC) model; and
    performing a correcting layout and simulating image quality step to the design layout, which comprises setting a plurality of pre-target points and pre-dissection points, electing a target point and a dissection point for correcting the segments of the layout pattern from the pre-target points and pre-dissection points according to a normalized image log slope (NILS) and a mask error enhancement factor (MEEF) of the pre-target points and pre-dissection points, and obtaining a corrected layout of the design layout according to the elected target point and a dissection point; and
    outputting the corrected layout to a mask;
    transferring the corrected layout from the mask to a substrate with light passing through the mask,
    wherein a plurality of sets of corrected segments are generated when setting the pre-target points or pre-dissection points, and the target point or the dissection point for correcting the segments of the layout pattern are elected according to the pre-target points or pre-dissection points that achieve the greatest NILS or the smallest MEEF.

2. The mask loading process as claimed in claim 1, wherein the image contrast is defined by a normalized image log slope (NILS), and the NILS is presented by the formula as follows:

$$NILS = w\frac{d\ln(l)}{dx},$$

wherein w is width of the opening of the mask, l is image intensity, x is position, and the greater the NILS of the measured image is, the greater the image contrast.

3. The mask loading process as claimed in claim 1, wherein the image contrast is defined by Mask error enhancement factor (MEEF), and MEEF is presented by the formula as follows:

$$MEEF = \frac{\partial CD_{resist}}{\partial CD_{mask}},$$

wherein $\partial CD_{mask}$ is critical dimension of the mask, $\partial CD_{resist}$ is the critical dimension of the resist exposed by the mask, and the smaller the MEEF of the measured image is, the greater the image contrast.

* * * * *